United States Patent
Kang et al.

(10) Patent No.: US 10,186,681 B2
(45) Date of Patent: Jan. 22, 2019

(54) ROLLABLE ORGANIC LIGHT EMITTING DIODE DISPLAY DEVICE

(71) Applicant: LG Display Co., Ltd., Seoul (KR)

(72) Inventors: Jin Goo Kang, Seoul (KR); Joo Hwan Shin, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/500,702

(22) PCT Filed: Jul. 31, 2015

(86) PCT No.: PCT/KR2015/008045
§ 371 (c)(1),
(2) Date: Jan. 31, 2017

(87) PCT Pub. No.: WO2016/024742
PCT Pub. Date: Feb. 18, 2016

(65) Prior Publication Data
US 2017/0222178 A1    Aug. 3, 2017

(30) Foreign Application Priority Data

Aug. 9, 2014 (KR) .................. 10-2014-0102691
Oct. 22, 2014 (KR) .................. 10-2014-0143029

(51) Int. Cl.
*H01L 29/08* (2006.01)
*H01L 51/40* (2006.01)
(Continued)

(52) U.S. Cl.
CPC .......... *H01L 51/5237* (2013.01); *H01L 27/32* (2013.01); *H01L 27/3276* (2013.01);
(Continued)

(58) Field of Classification Search
CPC ............. H01L 51/5237; H01L 51/0097; H01L 51/5253; H01L 51/5281; H01L 27/3276
See application file for complete search history.

(56) References Cited

U.S. PATENT DOCUMENTS

2007/0216639 A1   9/2007   LaFarre et al.
2007/0224434 A1   9/2007   Osada et al.
(Continued)

FOREIGN PATENT DOCUMENTS

CN        102738408 A    10/2012
KR    10-2010-0057531 A     5/2010

OTHER PUBLICATIONS

International Search Report and Written Opinion dated Oct. 30, 2015, for corresponding International Patent Application No. PCT/KR2015/008045.
(Continued)

*Primary Examiner* — Alonzo Chambliss
(74) *Attorney, Agent, or Firm* — Morgan, Lewis & Bockius LLP

(57) ABSTRACT

A rollable OLED display device according to an embodiment of the present disclosure is provided. The rollable OLED display device includes a rollable OLED display panel and a rolling unit. The rollable OLED display panel includes a display area and a non-display area that extends from the display area and includes a rolling unit attachment area. The rolling unit is in operative contact with the rolling unit attachment area of the rollable OLED display panel. It is configured to rotate such that the rollable OLED display panel is in a rolled state and an unrolled state. The rolling unit is formed in a cylindrical shape, and the rolling unit attachment area is defined by an arc of the cylindrical shape having an angle of 355° or less.

18 Claims, 9 Drawing Sheets

(51) Int. Cl.
*H01L 51/52* (2006.01)
*H01L 27/32* (2006.01)
*H01L 51/00* (2006.01)

(52) U.S. Cl.
CPC ...... *H01L 27/3297* (2013.01); *H01L 51/0097* (2013.01); *H01L 51/5253* (2013.01); *H01L 51/5281* (2013.01); *H01L 2251/5338* (2013.01); *Y02E 10/549* (2013.01)

(56) References Cited

U.S. PATENT DOCUMENTS

| | | |
|---|---|---|
| 2007/0241002 A1 | 10/2007 | Wu et al. |
| 2010/0182738 A1 | 7/2010 | Visser et al. |
| 2012/0050075 A1 | 3/2012 | Salmon |
| 2012/0248422 A1 | 10/2012 | Mine et al. |
| 2013/0037228 A1 | 2/2013 | Verschoor et al. |
| 2013/0127799 A1 | 5/2013 | Lee |
| 2013/0127917 A1 | 5/2013 | Kwack et al. |
| 2014/0217373 A1 | 8/2014 | Youn et al. |

OTHER PUBLICATIONS

The First Office Action dated Oct. 18, 2018, from the State Intellectual Property Office of People's Republic of China in counterpart Chinese application No. 201580042401.6.

[Fig. 1a]
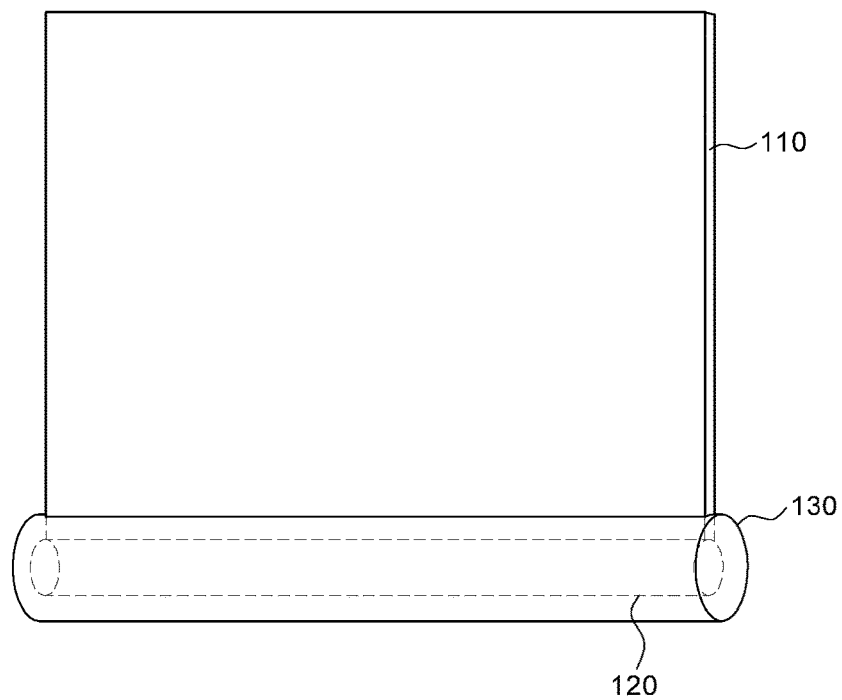
[Fig. 1b]
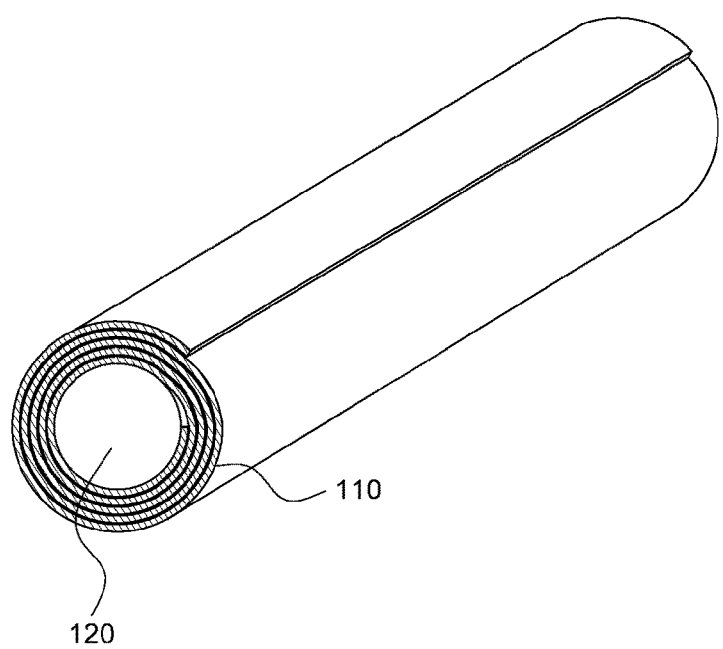

[Fig. 1c]
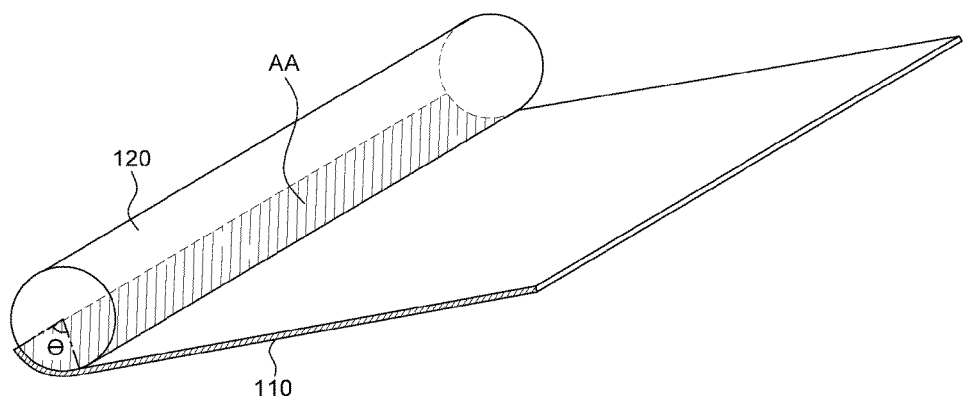
[Fig. 1d]
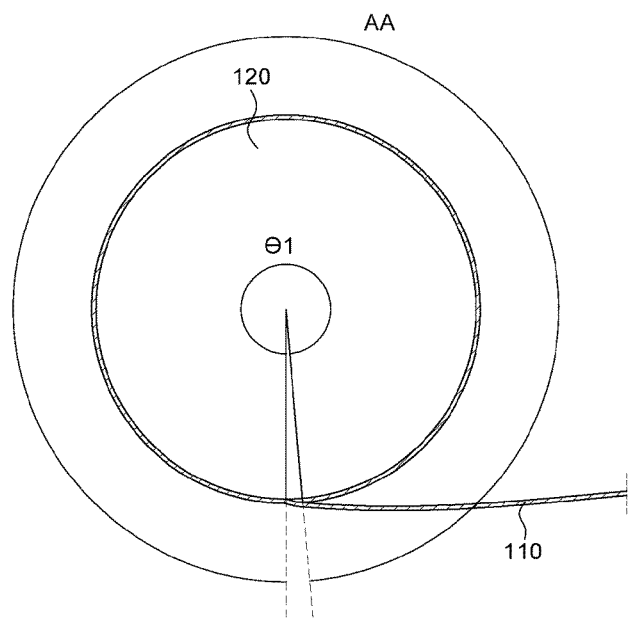

[Fig. 1e]
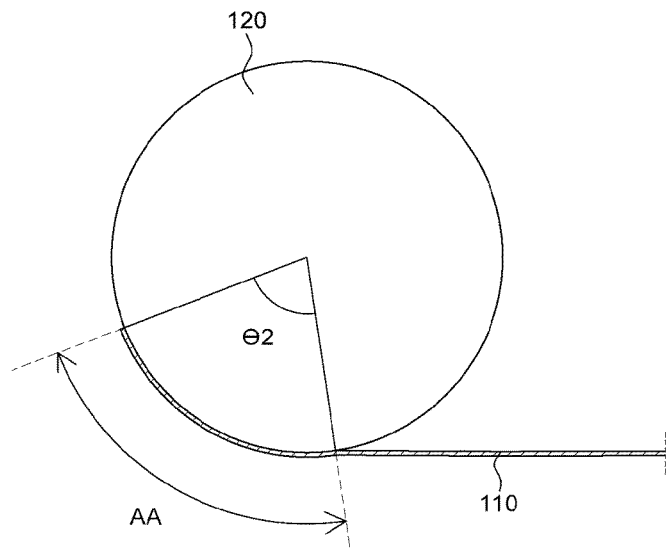
[Fig. 2]
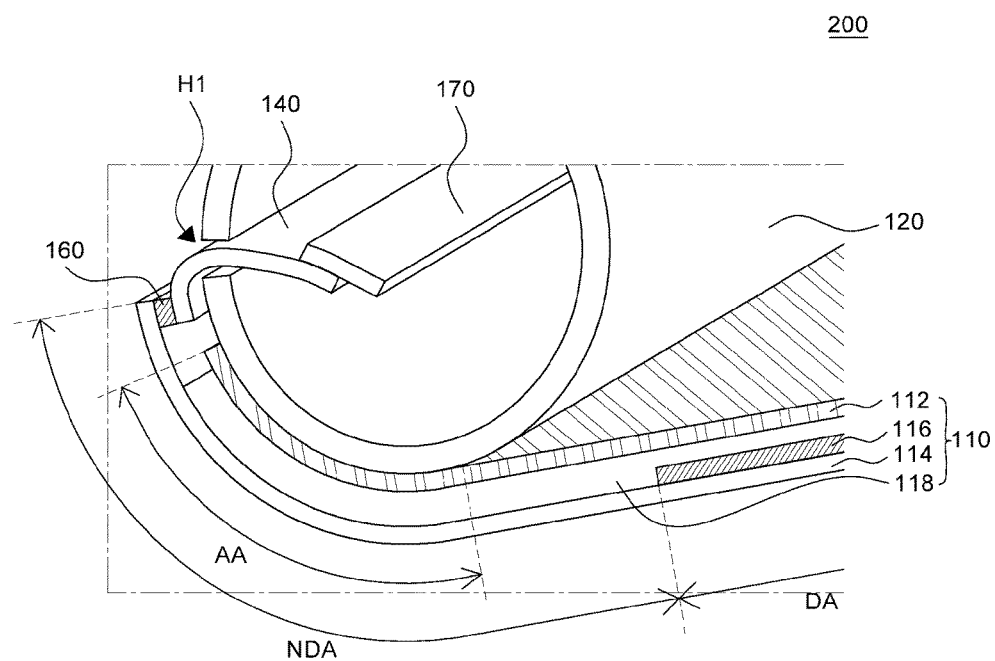

[Fig. 3]
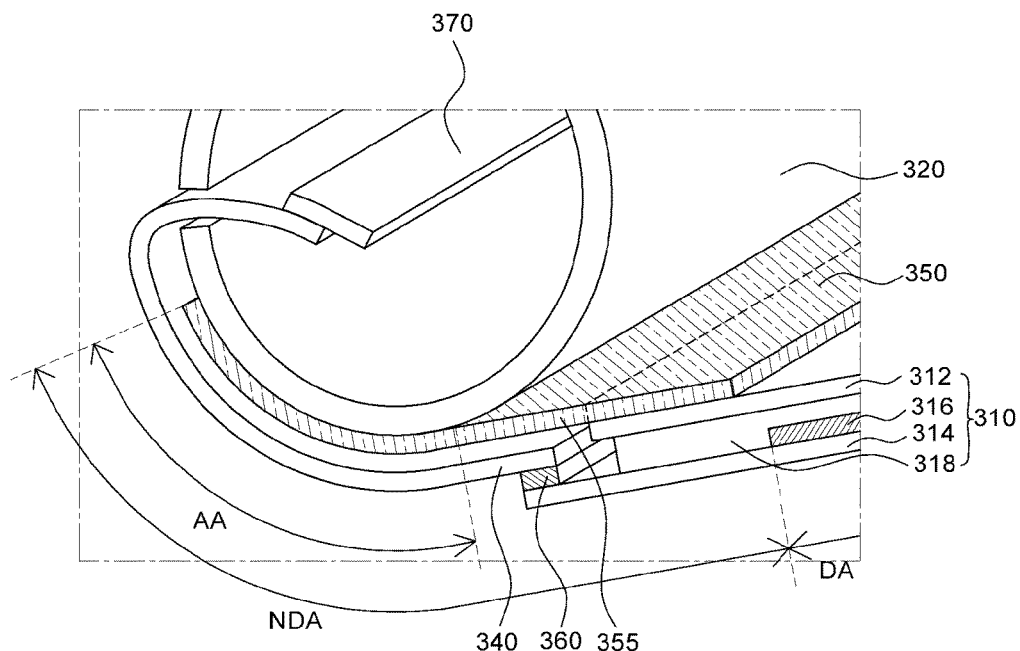
[Fig. 4]
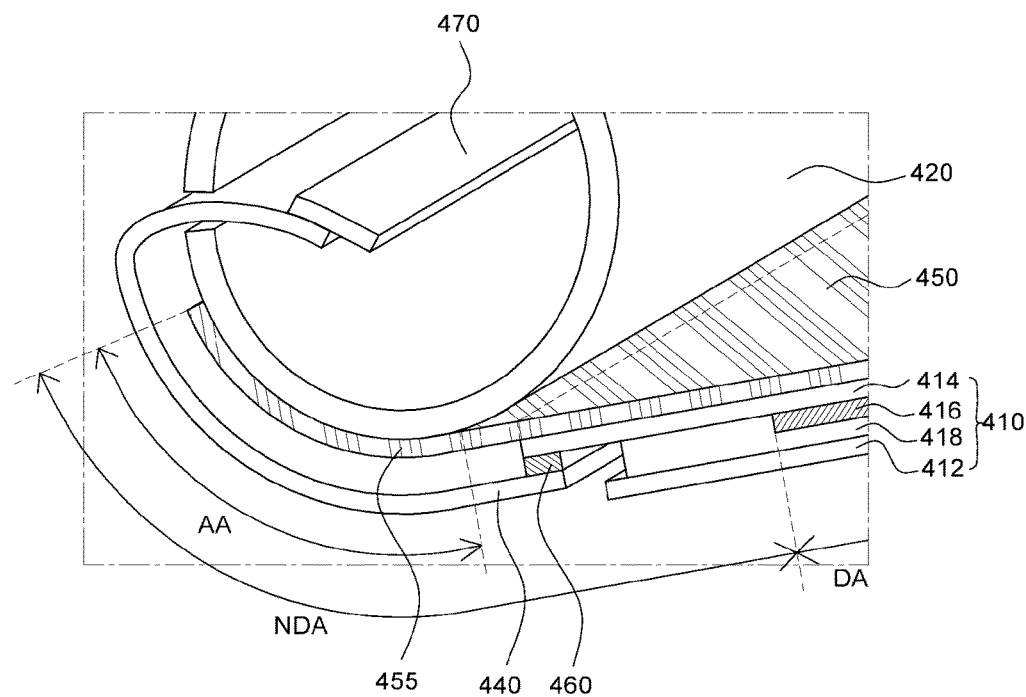

[Fig. 5b]
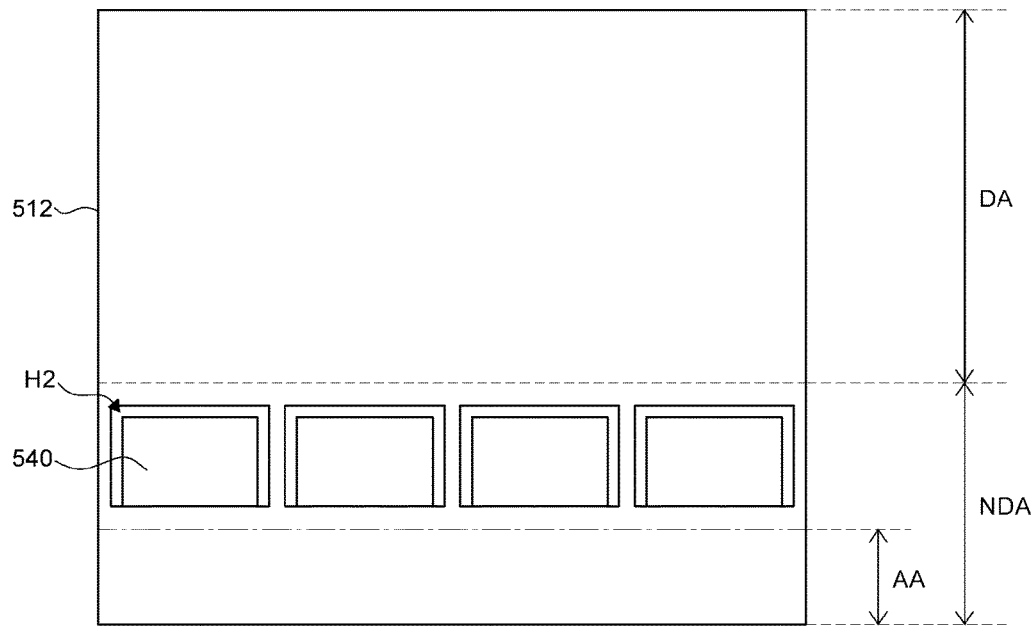
[Fig. 6a]
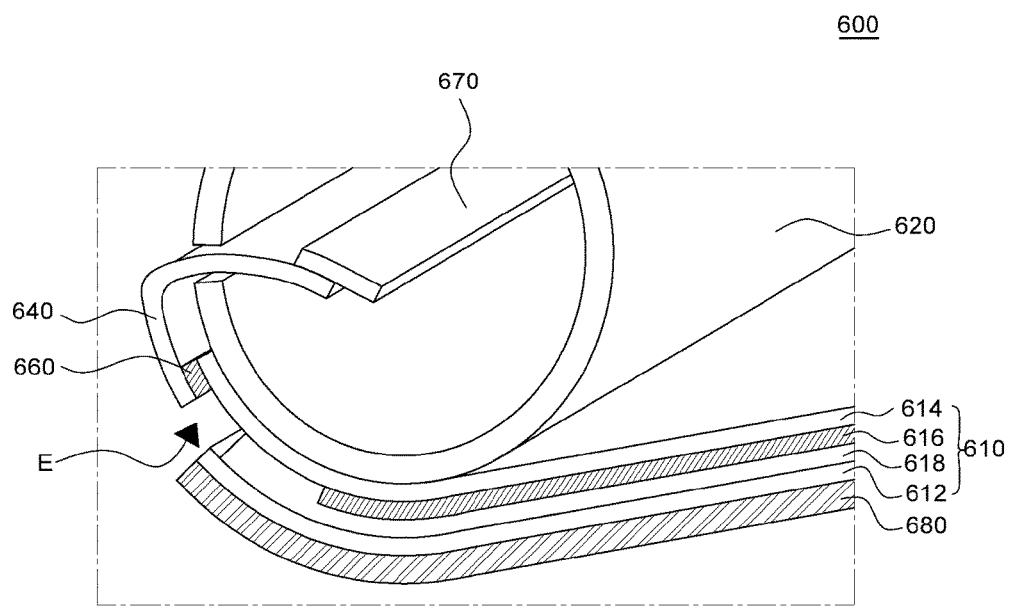

[Fig. 6b]
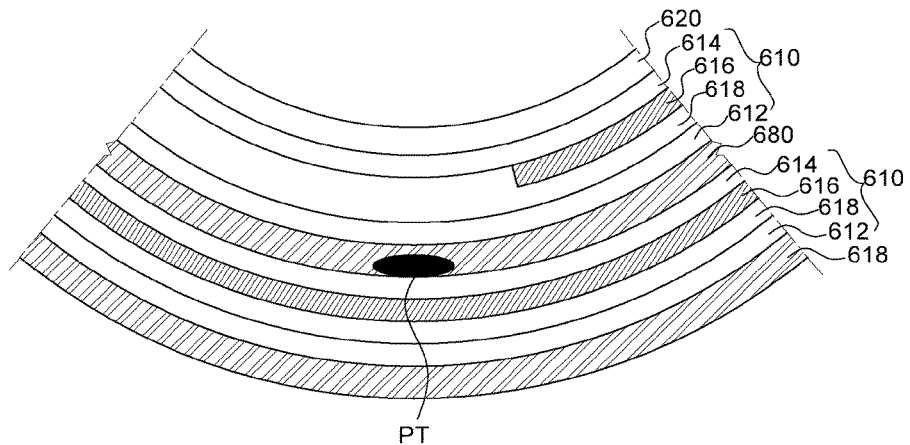
[Fig. 7]
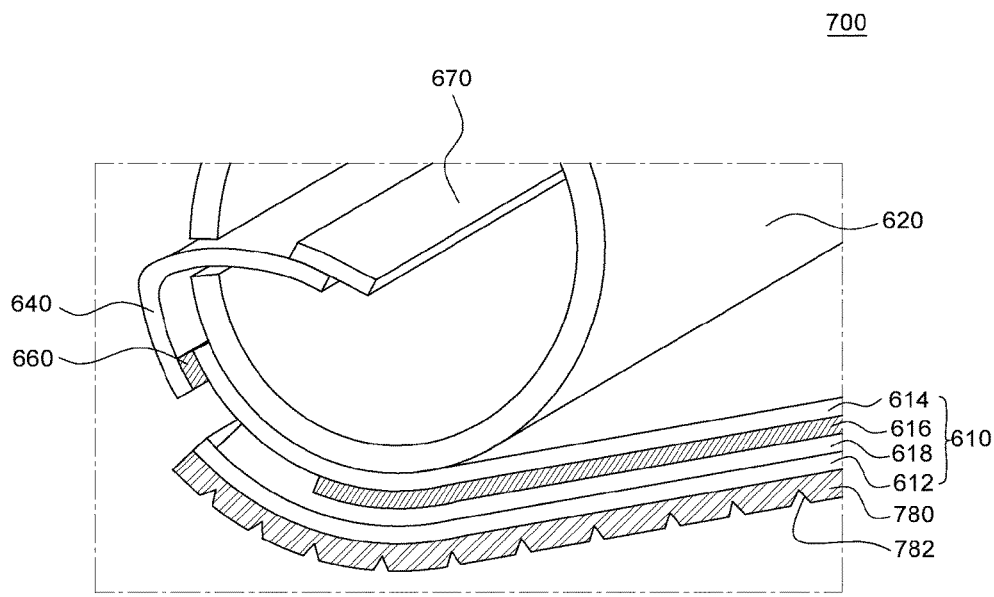

[Fig. 8]
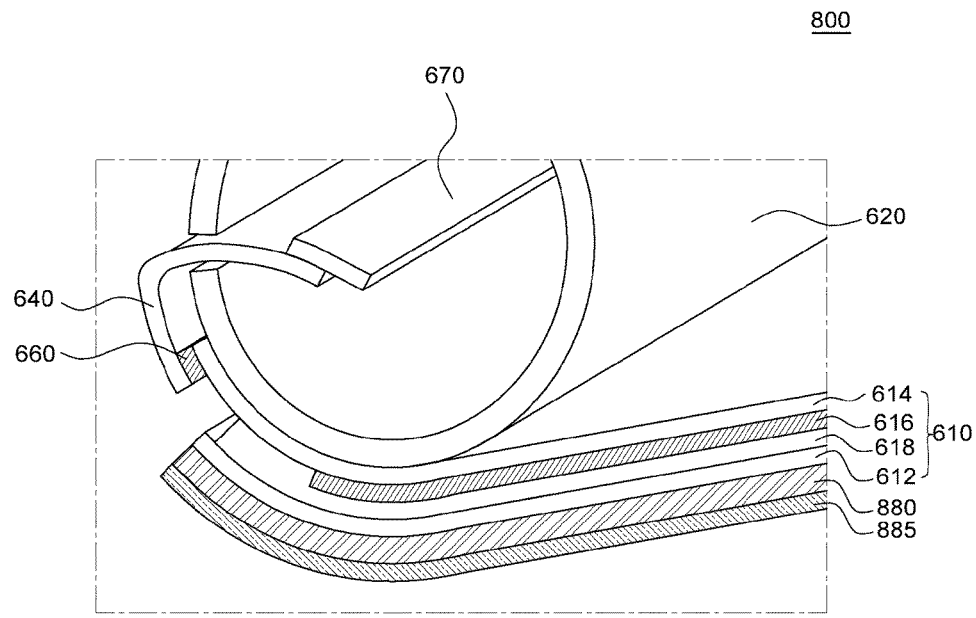
[Fig. 9]
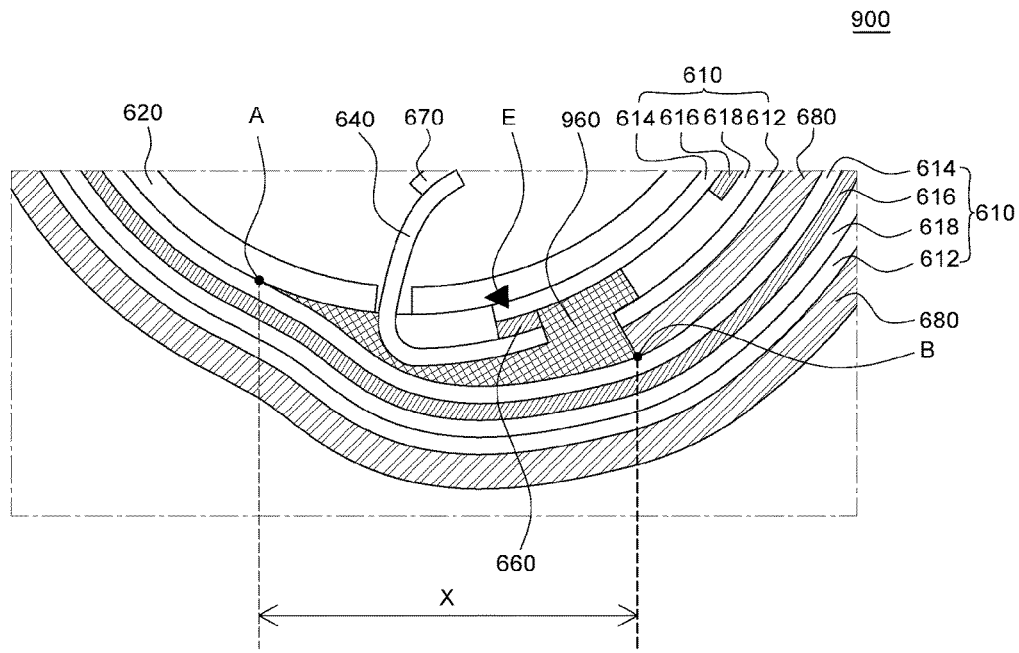

[Fig. 10]
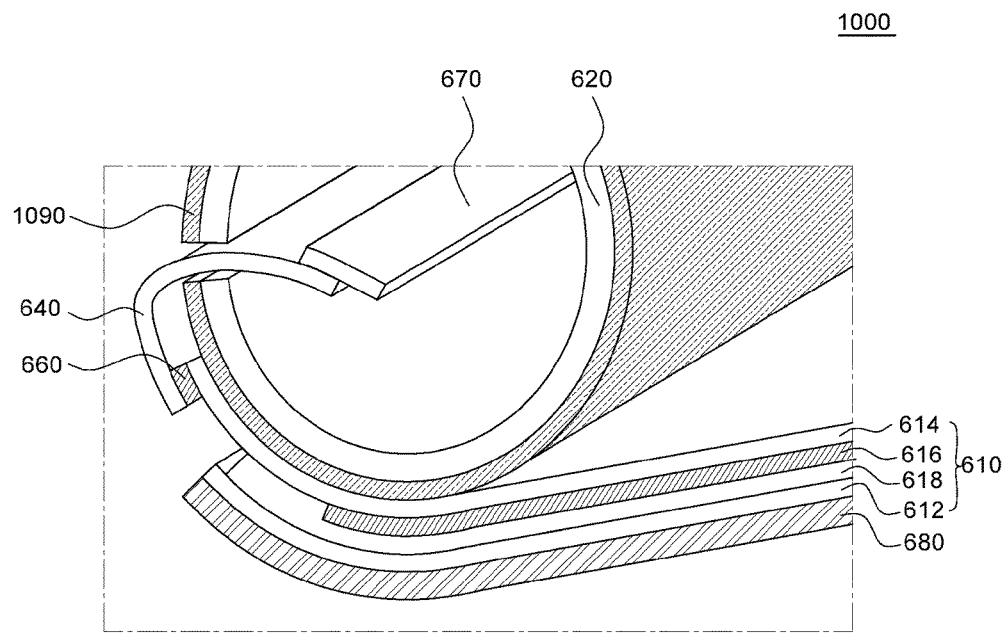
[Fig. 11]
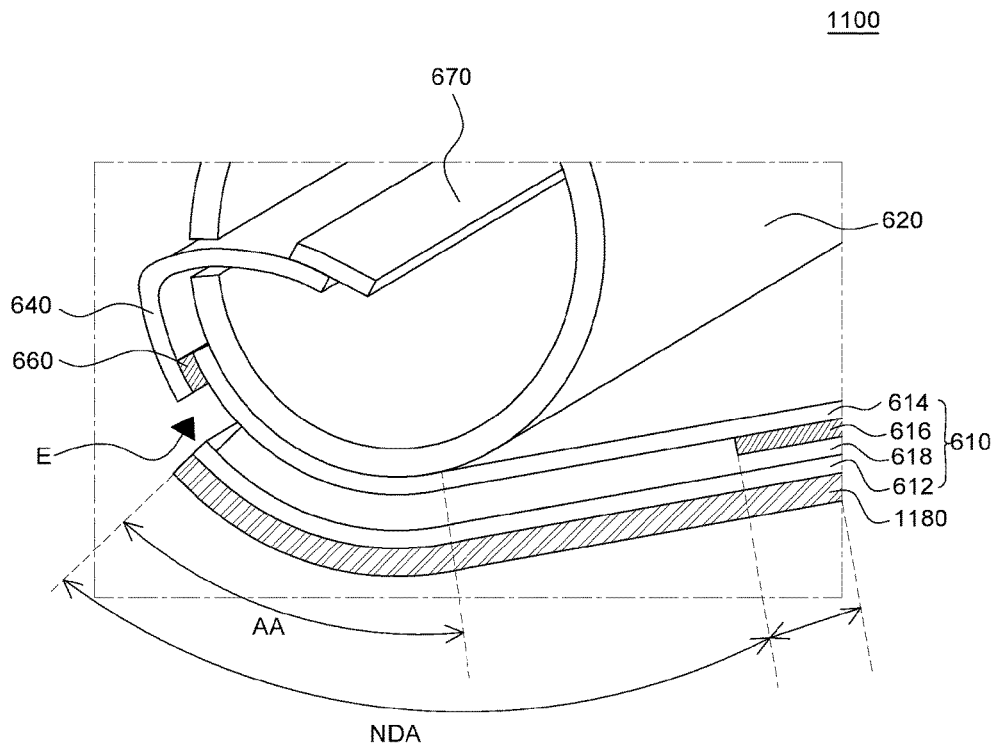

ROLLABLE ORGANIC LIGHT EMITTING DIODE DISPLAY DEVICE

TECHNICAL FIELD

Cross-reference to Related Applications

This application claims the priority of Korean Patent Application No. 10-2014-0102691 filed on Aug. 9, 2014, in the Korean Intellectual Property Office, the disclosure of which is incorporated herein by reference.

BACKGROUND

The present disclosure relates to a rollable organic light emitting diode (OLED) display device, and more particularly, to a rollable OLED display device with improved visibility and durability.

DESCRIPTION OF THE RELATED ART

An OLED display device is a self-light emitting diode display device that does not need a separate light source, and it can be manufactured in light and thin form. In addition, the OLED display device is advantageous in power consumption because it is driven by low voltage, is also capable of having excellent color expression, response speed, viewing angle, and contrast ratio (CR). It has been studied as a next-generation display.

Recently, a flexible OLED display device manufactured to display an image even when it is bent like paper has been noticed as a next-generation display device. The flexible OLED display device is broadly applied to a monitor of a computer, TV, and a personal portable device. Further, research on a flexible OLED display device having a wide display area and also a reduced volume and weight is being conducted.

In order to embody a rollable OLED display device in which a rollable OLED display panel can be rolled on a rollable rolling unit, various techniques have been developed.

A rollable OLED display device is embodied by operatively contacting a rolling unit and a rollable OLED display panel. The rolling unit has a cylindrical shaft and the rollable OLED display panel can be driven when it is bent with a radius of curvature equal to or less than a radius of the rolling unit.

The rollable OLED display device is operable in a rolled state and an unrolled state unlike a conventional flat display device. Since it is repeatedly switched between such two states, durability is crucial in the rollable OLED display device as compared with the flat display device operated in one unrolled state. In addition, in the rollable OLED display device, it is crucial for visibility in the unrolled state to be kept substantially equal to that of the flat display device.

As for durability of the rollable OLED device, since the rollable OLED display panel is exposed to the outside in the state where the rollable OLED display device is unrolled, a foreign material may be attached from the outside to the surface of the panel. The foreign material attached to the surface of the panel does not damage the rollable OLED display panel when the rollable OLED display device is in the unrolled state. However, when the rollable OLED display device is switched from the unrolled state to the rolled state, the foreign material may cause damage on the rollable OLED display panel, and consequently may have a negative influence on durability.

Specifically, foreign material attached to a non-light emitting surface or a light emitting surface of the rollable OLED display panel may damage an organic light emitting element by penetrating through a substrate or a sealing unit when the rollable OLED display panel is rolled and overlapped. In addition, even when the foreign material does not directly damage the organic light emitting element and when the foreign material passes through the sealing unit or the substrate, moisture and oxygen flows in from the outside, and a life of the organic light emitting element may be significantly shortened.

A method of removing a foreign material before the rollable OLED display panel is rolled on the rolling unit by using foreign material removing means such as air blowing was considered. However, it is difficult to remove a fine foreign material by the foreign material removing means, and other means for removing a foreign material greatly increases the size of the rollable OLED display device.

An object of the present disclosure is to provide a rollable OLED display device having a new structure with improved durability. This new structure can minimize damage of an organic light emitting element of a rollable OLED display panel caused by a foreign material, without increasing a volume of the rollable OLED display device.

Another object of the present disclosure is to provide a rollable OLED display device with improved durability. Such device is carried out by suppressing a foreign material from flowing into a part where a rollable OLED display panel starts overlapping when the rollable OLED display panel is rolled.

Meanwhile, concerning a visibility issue mainly considered in the rollable OLED display device, it is preferred that a housing and the like do not cover a display area of a rollable OLED display panel. Also, the entire of the rollable OLED display panel should be kept flat in an unrolled state. More specifically, the rollable OLED display panel is generally divided into a display area having a plurality of pixels for displaying a screen and a non-display area in which wires, a pixel driving unit, and the like are disposed. In this case, in order to allow the display area for displaying the screen to be visible from the outside, the rolling unit should not cover the display area in a state where the rollable OLED display device is completely unrolled. Also, the display area should not be bent by the rolling unit. Accordingly, the rolling unit is in operative contact with the non-display area of the rollable OLED display panel.

However, even when the rolling unit is in operative contact with the non-display area and when the rolling unit is too large, the rolling unit can cover the display area in a state where the rollable OLED display device is completely unrolled. In addition, even when the rolling unit is in operative contact with the non-display area, a portion of the rolling unit in operative contact and the display area are too adjacent to each other, and the display area is kept in the bent state. When the state of which the display area is covered or the bent display area is kept, of the ability to recognize a user on the screen may be decreased, and user satisfaction on the rollable OLED display device may be significantly decreased.

Accordingly, the inventors of the present disclosure recognized that there is a limit in space for operative contact of a rolling unit in a conventional rollable OLED display panel. Thus, a rollable OLED display panel having a new structure is necessary to embody a rollable OLED display device with improved visibility Furthermore, the inventors of the present disclosure invented a rollable OLED display device having a new structure, in which a display area is not bent or covered by a rolling unit in a state where the rollable OLED display device is completely unrolled.

Accordingly, still another object of the present disclosure is to provide a rollable OLED display device in which a display area is completely visible without a part bent or covered by a rolling unit.

Still another object of the present disclosure is to provide a rollable OLED display device in which a connection portion between a rolling unit and a rollable OLED display panel is configured as one of constituent elements of the rollable OLED display panel, thereby minimizing a manufacturing cost.

Objects of the present disclosure are not limited to the objects described above, and other objects which are not mentioned will be clearly understood by a person skilled in the art from the following description.

SUMMARY

According to an embodiment of the present disclosure, a rollable organic light emitting diode (OLED) display device is provided to achieve the objects described above. The rollable OLED display device includes a rollable OLED display panel and a rolling unit. The rollable OLED display panel includes a display area and a non-display area including a rolling unit attachment area, extending from the display area. The rolling unit is in operative contact with the rolling unit attachment area of the rollable OLED display panel, and is configured to rotate such that the rollable OLED display panel is in a rolled state and an unrolled state. The rolling unit is formed in a cylindrical shape, and the rolling unit attachment area is defined by an arc of the cylindrical shape having an angle of 355° or less. A component of the rollable OLED display panel extends outward such that the rollable OLED display panel is in operative contact with the rolling unit. Thus, adhesion between the rolling unit and the rollable OLED display panel is improved, and also durability of the rollable OLED display device can be improved.

According to another aspect of the present disclosure, when the rollable OLED display panel is in the unrolled state, the entire of the display area is exposed to the outside.

According to still another aspect of the present disclosure, the rolling unit attachment area is separated from the display area by at least a distance not concealing the display area by the rolling unit.

According to still another aspect of the present disclosure, the rollable OLED display panel includes a first substrate and a second substrate that is opposed to the first substrate and on which a pad unit connected to a circuit unit is disposed. The rolling unit is attached to the first substrate or the second substrate in the rolling unit attachment area.

According to still another aspect of the present disclosure, the first substrate is made of metal, and the rolling unit is attached to the first substrate in the rolling unit attachment area.

According to still another aspect of the present disclosure, an area of the first substrate is larger than an area of the second substrate.

According to still another aspect of the present disclosure, the first substrate includes an opening portion for exposing the pad.

According to still another aspect of the present disclosure, the rollable OLED display panel further includes a polarizing plate that has a part extending from an edge of the rollable OLED display panel. The rolling unit attachment area is in an area of the extending part of the polarizing plate, and the rolling unit is attached to the polarizing plate in the rolling unit attachment area.

According to still another aspect of the present disclosure, the rollable OLED display panel further includes a protective film that has a part extending from an edge of the rollable OLED display panel. The rolling unit attachment area is in an area of the extending part of the protective film, and the rolling unit is attached to the protective film in the rolling unit attachment area.

According to still another aspect of the present disclosure, the rollable OLED display panel further includes a connection unit that has a part extending from an edge of the rollable OLED display panel. The rolling unit attachment area is in an area of the extending part of the connection unit, and the rolling unit is attached to the connection unit in the rolling unit attachment area.

According to still another aspect of the present disclosure, the rollable OLED display device further includes a foreign material cover layer that is attached to a light emitting surface or a non-light emitting surface of the rollable OLED display panel. It has Young's modulus for covering a foreign material which may be attached to the rolling unit or the OLED display panel.

A rollable OLED display device according to another embodiment of the present disclosure is provided to achieve the objects described above. The rollable OLED display device includes a rollable OLED display panel, a rolling unit, and a foreign material cover layer. The rollable OLED display panel includes a substrate. The rolling unit is in operative contact with the rollable OLED display panel, and is configured to rotate such that the rollable OLED display panel is in a rolled state and an unrolled state. The foreign material cover layer is attached to a light emitting surface or a non-light emitting surface of the rollable OLED display panel, and has Young's modulus less than that of the substrate.

According to another aspect of the present disclosure, the Young's modulus of the foreign material cover layer is equal to or less than a half of the Young's modulus of the substrate or equal to or less than $4.8 \cdot 10^6$ psi (pound per square inch).

According to still another aspect of the present disclosure, a surface of the foreign material cover layer coming in contact with the rollable OLED display panel has adhesiveness.

According to still another aspect of the present disclosure, the foreign material cover layer has a notch or a concave portion for accommodating a foreign material.

According to still another aspect of the present disclosure, the rollable OLED display device further includes a charging prevention layer on the foreign material cover layer.

According to still another aspect of the present disclosure, the rollable OLED display device further includes a protective member for protecting an end portion of the rollable OLED display panel. The rolling unit is attached to the end portion of the rollable OLED display panel, and the thickness of the substrate at the end portion of the rollable OLED display panel is larger than the thickness of the substrate at the other portion of the rollable OLED display panel.

According to still another aspect of the present disclosure, the rollable OLED display device further includes an additional foreign material cover unit that is attached to at least a part of the surface of the rolling unit.

According to still another aspect of the present disclosure, the rollable OLED display panel is a bottom-emission OLED display panel.

According to still another aspect of the present disclosure, the rollable OLED display panel includes a component that extends outward from the rollable OLED display panel such that the rollable OLED display panel is attached to the rolling unit. Further, the component of the rollable OLED display panel includes at least one of: a first substrate; a second substrate that is opposed to the first substrate; a polarizing plate on the first substrate or the second substrate; a protective film on the first substrate or the second substrate; a connection portion that has a portion extending from an edge of the rollable OLED display panel.

Specifications of other embodiments are included in the detailed description and the drawings.

In a rollable OLED display device according to an embodiment of the present disclosure, both of visibility on a display area of a rollable OLED display panel and durability are improved due to reduction of damage caused by impurities.

According to an embodiment of the present disclosure, since an area to which a rolling unit is attached is not overlapped with a display area in an unrolled state and the display area is not bent by the rolling unit, it is possible to provide a rollable OLED display device with improved visibility.

In addition, according to an embodiment of the present disclosure, a portion at which a rolling unit and a rollable OLED display panel are attached is configured by one of constituent elements of the rollable OLED display panel, thereby providing a rollable OLED display device with a manufacturing cost minimized.

In addition, according to an embodiment of the present disclosure, even when a rollable OLED display device is repeatedly switched between a rolled state and an unrolled state, it is possible to minimize an influence on a rollable OLED display panel by a foreign material from the outside. Thus, it is possible to provide a rollable OLED display device with durability improved.

Furthermore, according to an embodiment of the present disclosure, a protective member is disposed in an area of a rolling unit where a rollable OLED display panel starts overlapping. A space into which a foreign material may flow is thereby removed, and it is possible to reduce damage caused by rolling of the rollable OLED display panel on the rolling unit. Advantages according to various embodiments of the present disclosure are not limited by the description exemplified above, and more various advantages are included in the specification.

BRIEF DESCRIPTION OF DRAWINGS

FIG. 1a is a schematic perspective view illustrating a rollable OLED display device according to an embodiment of the present disclosure.

FIG. 1b is a schematic perspective view illustrating a state where a rollable OLED display device is rolled according to an embodiment of the present disclosure.

FIG. 1c is a schematic perspective view illustrating a state where a rollable OLED display device according to an embodiment of the present disclosure is unrolled.

FIG. 1d and FIG. 1e are schematic cross-sectional views illustrating a rollable OLED display device according to an embodiment of the present disclosure to explain a rolling unit attachment area.

FIG. 2 is a schematic enlarged cross-sectional view illustrating a rollable OLED display device according to an embodiment of the present disclosure.

FIG. 3 to FIG. 5a are schematic enlarged cross-sectional views illustrating a rollable OLED display device according to various embodiments of the present disclosure.

FIG. 5b is a schematic plan view illustrating a rollable OLED display device according to various embodiments of the present disclosure to explain an opening portion illustrated in FIG. 5a.

FIG. 6a is a schematic enlarged cross-sectional view illustrating a rollable OLED display device according to another embodiment of the present disclosure.

FIG. 6b is a schematic enlarged cross-sectional view for explaining a case where a foreign material flows into a rollable OLED display device according to another embodiment of the present disclosure.

FIG. 7 to FIG. 11 are schematic enlarged cross-sectional views illustrating a rollable OLED display device according to various embodiments of the present disclosure.

DETAILED DESCRIPTION OF THE PREFERRED EMBODIMENT

Figure 5A:
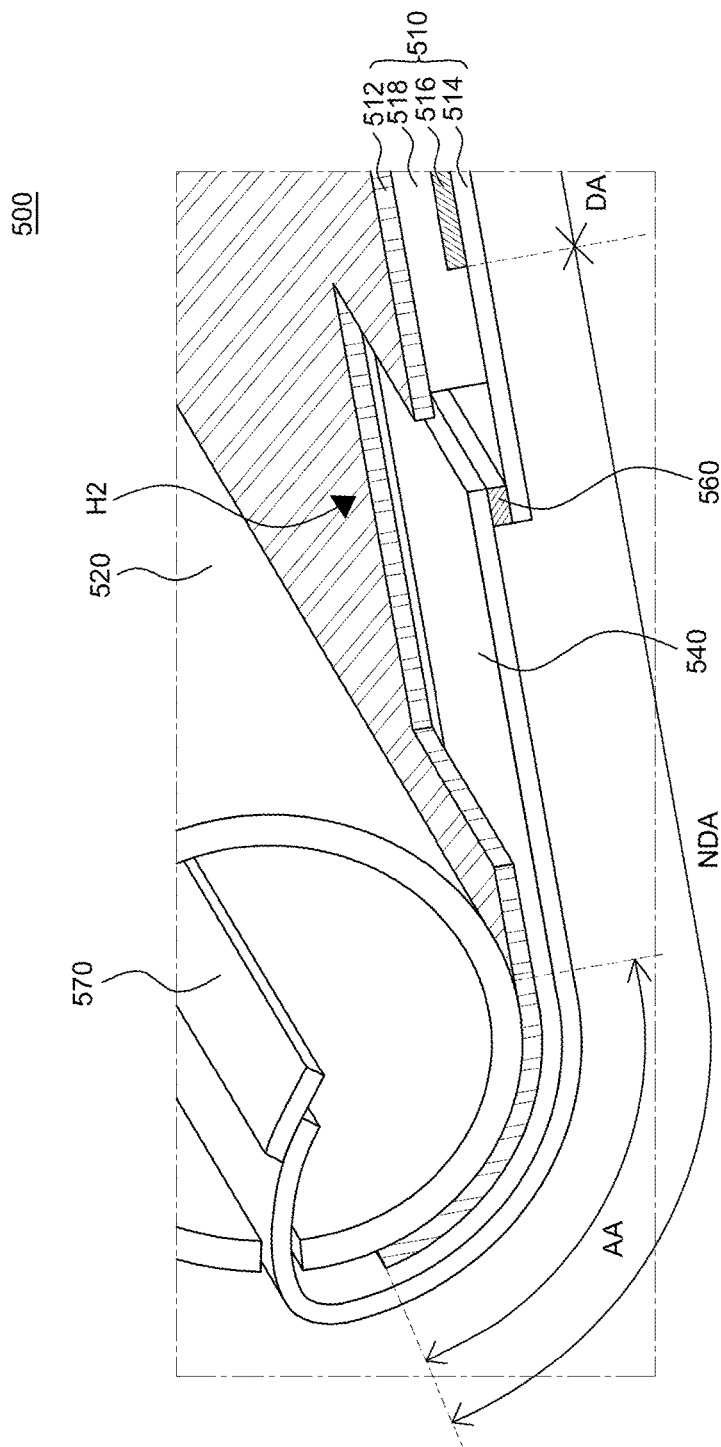

Advantages and features of the present disclosure and method of achieving them will be clarified with reference to the embodiments described below in detail with the accompanying drawings. However, the present disclosure is not limited to the embodiments described below, and will be embodied in various forms. The embodiments make the present disclosure complete, and is provided to allow a person skilled in the art to completely know the scope of the present disclosure, but is defined only by the scope of Claims.

Shapes, sizes, ratios, angles, the number of components, and the like disclosed in the drawings for describing the embodiments of the present disclosure are exemplary, and the present disclosure is not limited to the illustration. In addition, in the description of the present disclosure, when it is determined that specific description about the related known technique may unnecessarily blur the gist of the present disclosure, detailed description thereof is omitted. When 'include', 'have', 'comprise', and the like mentioned in the specification are used, other parts may be added unless 'only' is used. When a constituent element is expressed by a singular form, it includes a plurality form unless there is specific description.

In analyzing constituent elements, they include an error range even when there is no separate description.

In description of positional relations, when a positional relation between two parts is described with, for example, 'on', 'at an upper portion', 'under', 'at a lower portion', 'near', and the like, one or more other parts may be positioned between two parts unless 'right' or 'directly' is used.

Description that a device or a layer is "on" another device or layer includes all cases where another layer or another device is interposed right on another device or in between.

Although the first, the second, or the like are used to describe various constituent elements, the constituent elements are not limited by these terms. These terms are used merely to distinguish one constituent element from the other constituent element. Accordingly, the first constituent element mentioned hereinafter may be the second constituent element within the technical spirit of the present disclosure.

Throughout the specification, the same reference numerals and signs denote the same constituent elements.

A size and a thickness of each configuration illustrated in the drawings are illustrated for convenience of description, but the present disclosure is not necessarily limited to the size and the thickness of the illustrated configuration.

Features of various embodiments of the present disclosure can be partially or entirely coupled or combined with each other, and can technically variously interlocked or operated as can be sufficiently understood by a person skilled in the art, and the embodiments may be embodied independently from each other, and may be embodied together in cooperation with each other.

Hereinafter, various embodiments of the present disclosure will be described in detail with reference to the accompanying drawings.

FIG. 1a is a schematic perspective view illustrating a rollable OLED display device according to an embodiment of the present disclosure. FIG. 1b is a schematic perspective view illustrating a state where a rollable OLED display device is rolled according to an embodiment of the present disclosure. FIG. 1c is a schematic perspective view illustrating a state where a rollable OLED display device according to an embodiment of the present disclosure is unrolled.

A rollable OLED display device 100 is operable in a rolled state and an unrolled state. Referring to FIG. 1a, the rollable OLED display device 100 includes a rollable OLED display panel 110, a rolling unit 120, and a housing 130 for fixing the rolling unit 120 and supporting constituent elements.

The rollable OLED display panel 110 is an OLED display panel with flexibility. The rollable OLED display panel 110 can be rolled like a scroll, and can be driven even when it has a radius of curvature equal to or less than a radius of the rolling unit 120. The rollable OLED display panel 110 includes a plurality of pixels for representing a screen, and includes constituent elements for driving the plurality of pixels.

The rolling unit 120 is configured to roll and unroll the rollable OLED display panel 110. In other words, the rolling unit 120 is configured to rotate such that the rollable OLED display panel 110 is in a rolled state and an unrolled state. The rolling unit 120 includes a body unit for rolling the rollable OLED display panel 110 and a motor for rotating the rolling unit 120. The body unit is formed, for example, in a cylindrical shape, and the rolling unit 120 may be formed substantially in a cylindrical shape. The motor is positioned in or outside of the rolling unit 120, and can rotate the rolling unit 120 clockwise or anticlockwise.

The housing 130 fixes the rolling unit 120, and protects the rolling unit 120 and the rollable OLED display panel 110 from an external impact and the like. The housing 130 is configured to fix a part of the rolling unit 120 such that the rolling unit 120 rotates. The housing 130 may include or be integrated with a power supply unit, a speaker, a control board, and the like.

The rollable OLED display device 100 is configured to be switched between a rolled state and an unrolled state. The rollable OLED display device 100 is in the rolled state when it does not operate. Referring to FIG. 1b, the rolled state of the rollable OLED display device 100 is illustrated. The rolled state is a state in which the rollable OLED display panel 110 is rolled on the rolling unit 120. The rolled state may be a state in which the rollable OLED display panel 110 is rolled on the rolling unit 120 a plurality of times. When the rollable OLED display device 100 is rolled, it becomes easy to carry it and since the panel is not revealed, anaesthetic appreciation can be improved.

The rollable OLED display device 100 is in the unrolled state when it operates. Referring to FIG. 1c, the unrolled state of the rollable OLED display device 100 is illustrated. The unrolled state is a state in which a part of the rollable OLED display panel 110 is operatively attached to the rolling unit 120, and the other part of the rollable OLED display panel 110 except for the attached part does not come in contact with the rolling unit 120. In other words, the unrolled state is a state where the rollable OLED display panel 110 is exposed to a user to display a screen to the user. When the rollable OLED display device 100 is unrolled, the user can view an image from the rollable OLED display panel 110.

In FIG. 1c, the rollable OLED display device 100 has a rolling unit attachment area AA. The rolling unit attachment area AA is an area where the rolling unit 120 and the rollable OLED display panel 110 are operatively attached to each other. When the rolling unit 120 is cylindrical in shape, the rolling unit attachment area AA is a partial area of a side of the rolling unit 120. A part of the side of the cylindrical shape may be defined by an upper face arc and a lower face arc of the cylindrical shape, and lines of the side connecting the arcs. In the rollable OLED display device 100 according to an embodiment of the present disclosure, the rolling unit attachment area AA is defined by a cylindrical arc having an angle of 355° or less. An area of the rolling unit attachment area AA can be calculated by multiplying a length of an arc by height of a cylinder. Since the rolling unit attachment area AA is defined by the cylindrical arc having the angle of 355° or less, the rollable OLED display panel 110 is operatively attached to surround a part of the side of the rolling unit 120.

FIG. 1d and FIG. 1e are schematic cross-sectional views of a rollable OLED display device according to an embodiment of the present disclosure to explain a rolling unit attachment area. FIG. 1d and FIG. 1e illustrate that arcs defining the rolling unit attachment area AA have different angles between the rolling unit 120 and the rollable OLED display panel 110.

Referring to FIG. 1d, the arc defining the rolling unit attachment area AA has an angle q1 of 355°. Accordingly, the rollable OLED display panel 110 surrounds substantially the entire face of the rolling unit 120. When the cylindrical arc defining the rolling unit attachment area AA has an angle more than 355°, the rollable OLED display panel 110 may have too large radius of curvature in an area where the rollable OLED display panel 110 surrounding the rolling unit 120 is overlapped. When the radius of curvature becomes large, the organic light emitting element of the rollable OLED display panel 110 may be damaged.

Referring to FIG. 1e, the arc defining the rolling unit attachment area AA has an angle q2 of equal to or greater than 80° or less than 355°. In FIG. 1e, the rollable OLED display panel 110 is operatively attached to surround a part of a side of the rolling unit 120, and the rollable organic light emitting display diode display panel 110 is in the completely unrolled state. Hereinafter, as illustrated in FIG. 1e, various configurations of the rollable OLED display panel 110 coming in contact with the rolling unit 120 in the rolling unit attachment area AA defined by the arc having the angle equal to or less than 355° will be described.

FIG. 2 is a schematic enlarged cross-sectional view illustrating a rollable OLED display device 200 according to an embodiment of the present disclosure. In FIG. 2, for convenience of description, an exaggerated scale is used. For example, a rolling unit 120 may be embodied larger than one illustrated in FIG. 2, and thickness of a rollable OLED display panel 110 may be thinner. Referring to FIG. 2, a rollable OLED display device 200 includes: a rollable OLED display panel 110 including a first substrate 112, a second substrate 114, a display unit 116, an adhesive layer 118, a pad unit 160, and a flexible printed circuit board 140; a rolling unit 120; and a circuit unit 170.

The first substrate 112 and the second substrate 114 support various constituent elements of the rollable OLED display panel 110. The second substrate 114 is opposed to the first substrate 112. The first substrate 112 and the second substrate 114 are made of a material with flexibility, and may be made of, for example, transparent plastic such as polyimide, or thin metal to the extent to have flexibility. The display unit 116 is formed on the second substrate 114, and has a thin film transistor, an organic light emitting element, and the like, to display a screen.

The adhesive layer 118 for joining the first substrate 112 and the second substrate 114 is interposed between the first substrate 112 and the second substrate 114. Various materials may be used as the adhesive layer 118, for example, a thermosetting material or a photocurable material may be used.

The flexible printed circuit board 140 is a printed circuit board having flexibility, and the flexible printed circuit board 140 is provided with a control unit such as an IC chip and a circuit unit. The flexible printed circuit board 140 is configured to transmit a signal for driving the organic light emitting element of the display unit 116 from the control unit to the organic light emitting element.

The pad unit 160 is a pad for connecting the flexible printed circuit board 140, and is formed on the upper face of the second substrate 114. The pad unit 160 may be formed of the same material as one of various conductive materials constituting the thin film transistor and the organic light emitting element formed in the display unit 116.

The rollable OLED display panel 110 includes a display area DA and a non-display area NDA. The display area is an area where a screen is displayed and also an area where the display unit 116 having the thin film transistor, the organic light emitting element, and the like is formed. The non-display area NDA is an area where an image is not displayed in the rollable OLED display panel 110. Also, it is an area where various wires, a driving unit, and the like are formed.

The non-display area NDA includes the rolling unit attachment area AA. The rolling unit attachment area AA is not overlapped with the display area DA. When the rolling unit attachment area AA is overlapped with the display area DA, a part of the rollable OLED display panel 110 may be bent by the rolling unit 120, and a distorted screen may be recognized by a user. The rolling unit attachment area AA is separated from the display area DA by at least a distance not concealing the display area DA by the rolling unit 120.

Furthermore, even when the rolling unit attachment area AA is included in the non-display area NDA and when the rolling unit 120 is too large, the rolling unit 120 may cover the display area DA even in a state where the rollable OLED display device 200 is completely unrolled. In addition, even when the rolling unit 120 is operatively attached to the non-display area NDA, the display area NA is too adjacent to the operatively attached portion of the rolling unit 120, and the display area DA may be seen as bent.

In order to solve such a problem, the rollable OLED display device 200 according to an embodiment of the present disclosure is configured such that the rolling unit attachment area AA is separated from the display area DA. Further, the entire area of the display area DA is exposed to the outside when the rollable OLED display panel 110 is in the unrolled state.

The formation of which the rolling unit attachment area AA is separated from the display area DA may be embodied by various configurations. The rolling unit 120 may come in contact with one of various components of the rollable OLED display panel 110. In other words, the components of the rollable OLED display panel may extend outside the rollable OLED display panel such that the rollable OLED display panel is operatively attached to the rolling unit. For example, the components of the rollable OLED display panel 110 may be at least one of the first substrate 112, the second substrate 114 opposed to the first substrate 112, a polarizing plate on the first substrate 112 or the second substrate 114, a protective film on the first substrate 112 or the second substrate 114, and a connection unit having a portion extending from an edge of the rollable OLED display panel 110. Various embodiments of the components will be described later with reference to FIG. 3 to FIG. 5b.

The rolling unit 120 and various components of the rollable OLED display panel 110 may be attached to each other by an adhesive film, a liquid adhesive, a curable material, or the like. Referring to FIG. 2, the rolling unit 120 is operatively attached to the first substrate 112 of the rollable OLED display panel 110. In FIG. 2, the first substrate 112 and the second substrate 114 extend from the display area DA, the non-display area NDA includes the rolling unit attachment area AA, and the rolling unit attachment area AA extends to be separated from the display area DA. The rollable OLED display panel 110 of the rollable OLED display device 200 according to an embodiment of the present disclosure has the non-display area NDA extending to secure the rolling unit attachment area AA. Further, the first substrate 112 and the second substrate 114 may be extended to serve the purpose above.

The first substrate 112 may be made of metal, and the display unit 116 may be a bottom-emission organic light emitting element in which light emitted from the organic light emitting element is discharged in a direction of the second substrate 114 on which a thin film transistor for driving the organic light emitting element is formed.

Referring to FIG. 2, the flexible printed circuit board 140 connected to the pad unit 160 is positioned in the rolling unit 120 through an opening portion H1 of the rolling unit 120. The flexible printed circuit board 140 may be connected to the circuit unit 170. When the flexible printed circuit board 140 and the circuit unit 170 are positioned in the rolling unit 120, the circuit unit 170 is not pressurized when the rollable OLED display panel 110 is rolled on the rolling unit 120. When circuit unit 170 is less pressurized, physical damage of the circuit unit 170 is reduced, and durability of the rollable OLED display device 200 is improved.

The rollable OLED display device 200 according to an embodiment of the present disclosure illustrated in FIG. 2 secures the rolling unit attachment area AA defined by the cylindrical arc having the angle equal to or less than 355° by extending of the first substrate 112 and the second substrate 114. Accordingly, in the rollable OLED display device 200, visibility of the screen displayed in the display area DA can be improved.

FIG. 3 is a cross-sectional view of an OLED display device according to another embodiment of the present disclosure. In FIG. 3, a display unit 316 and an adhesive layer 318 of a rollable OLED display panel 310 are substantially the same as the display unit 116 and the adhesive layer 118 described with reference to FIG. 2, and thus the repeated description is omitted.

Referring to FIG. 3, in the rollable OLED display device 300 according to another embodiment of the present disclosure, a separate connection unit 350 is included in the rollable OLED display panel 310. A rolling unit 320 is attached to a separate connection unit 350, and is operatively attached to the rollable OLED display panel 310. In other words, in FIG. 3, a first substrate 312 and a second substrate 314 of the rollable OLED display panel 310 do not extend in order to allow a rolling unit attachment area AA to be included in a non-display area NDA.

A part of the connection unit 350 overlapped with the first substrate 312 is operatively attached to one face of the rollable OLED display panel 310. The other part of the connection unit 350 which is not overlapped with the first substrate 312 extends from the first substrate 312 of the rollable OLED display panel 310. In other words, the connection unit 350 is formed outside a display area DA on the first substrate 310. The connection unit 350 has an extending portion 355 from an edge of the second substrate 314. The rolling unit attachment area AA is defined in the extending portion 355 of the connection portion 350.

If the connection unit 350 can be operatively attached to the rolling unit 320, it is not limited and may be made of various materials. For example, the connection unit 350 may be formed of the same material as that of the first substrate 312. Since the connection unit 350 and the first substrate 312 are subjected to similar stress at the time of rolling, when the connection unit 350 is formed of the same material as that of the first substrate 312, stress applied to the constituent elements of the rollable OLED display panel 310 is uniform. Further, damage caused by high stress in a specific area can be reduced.

When the connection unit 350 is separately included in the rollable OLED display panel 310 and when the rolling unit 320 is operatively attached to the rollable OLED display panel 310 through the connection unit 350, the rolling unit attachment area AA can be separated from the display area DA. The separation can occur even while design of the rollable OLED display panel 310 is not greatly changed. For example, even when the lengths of the first substrate 312 and the second substrate 314 or design of wiring crossing thereon are not changed, it is possible to secure the rolling unit attachment area AA.

In addition, a flexible printed circuit board 340 connected to a pad unit 360 extends and is positioned in the rolling unit 320. The flexible printed circuit board 340 is connected to a circuit unit 370 in the rolling unit 320.

FIG. 4 is a cross-sectional view illustrating a rollable OLED display device according to still another embodiment of the present disclosure. In FIG. 4, a display unit 416, an adhesive layer 418 of a rollable OLED display panel 410, flexible printed circuit board 440, pad unit 460, and circuit unit 470 are substantially the same as the display unit 116, the adhesive layer 118, flexible printed circuit board 140, pad unit 160, and circuit unit 170 described with reference to FIG. 2 or similar elements of FIG. 3, and the overlapped description is omitted. In FIG. 4, it is assumed that an organic light emitting element is a bottom-emission organic light emitting element. Accordingly, light from the organic light emitting element is emitted in a direction of a second substrate 414, and the first substrate 412 is made of metal.

Referring to FIG. 4, in a rollable OLED display device 400 according to still another embodiment of the present disclosure, a rollable OLED display panel 410 includes a polarizing plate 450. The polarizing plate 450 is disposed on a front face of the second substrate 414. In addition, the polarizing plate 450 has a portion 455 extending from an edge of the second substrate 414. The rolling unit attachment area AA is defined in the extending portion 455 of the polarizing plate 450. The rolling unit 420 is attached to the extending portion 455 of the polarizing plate 450, and the rolling unit 420 is thereby operatively attached to the rollable OLED display panel 410.

When the polarizing plate 450 is disposed on the second substrate 414 OLED and the rolling unit 420 is operatively attached to the rollable OLED display panel 410 through the extending portion 455 of the polarizing plate 450, the rolling unit attachment area AA can be separated from the display unit area DA. The separation can occur even when design of the rollable OLED display panel 410 is not greatly changed. Accordingly, when the rollable OLED display device 400 is in the unrolled state, the display area DA is not covered or bent. In addition, in the rollable OLED display panel 410 using the polarizing plate 450, it is possible to secure the rolling unit attachment area AA by extending the polarizing plate 450, and thus a manufacturing cost can be relatively reduced.

Meanwhile, in FIG. 4, it is illustrated that the polarizing plate 450 is attached to the second substrate 414 on the assumption that the organic light emitting element of the rollable OLED display panel 410 is the bottom-emission organic light emitting element. However, the polarizing plate 450 may be attached to the first substrate 412 according to emission types of the organic light emitting element. In addition, it is not limited to the polarizing plate 450 illustrated in FIG. 4, and a protective film which may be formed on a front face of the first substrate 412 or the second substrate 414 of the rollable OLED display panel 410. Or, an optical film different from the polarizing plate 450 may be used. In other words, the protective film or the optical film has the extending portion 455, and the rolling unit attachment area AA may be thereby secured.

Similarly to the rollable OLED display device 400 illustrated in FIG. 4, the portion where the rolling unit 420 the rollable OLED display panel 410 are operatively attached is configured by the polarizing plate 450 or the protective film. Accordingly, a new process is not added and a manufacturing cost of the rollable OLED display device 400 can be minimized.

FIG. 5a is a cross-sectional view illustrating a rollable OLED display device according to various embodiments of the present disclosure. In FIG. 5a, a display unit 516 and an adhesive layer 518 of a rollable OLED display panel 510 are substantially the same as the display unit 116 and the adhesive layer 118 described with reference to FIG. 2, and the overlapped description is omitted.

Referring to FIG. 5a, in a rollable OLED display device 500 according to various embodiments of the present disclosure, only a first substrate 512 of a rollable OLED display panel 510 extends to secure a rolling unit 520 attachment area. The first substrate 512 extends from the display area DA, the non-display area NDA includes the rolling unit attachment area AA, and the rolling unit attachment area AA extends to be separated from the display area DA. Accordingly, an area of the first substrate 512 is formed to be larger than the area of the second substrate 514. However, when only the first substrate 512 is extended, the first substrate 512 covers a pad portion 560 on the second substrate 514. Since a flexible printed circuit board 540 is coupled after the first substrate 512 and the second substrate 514 are joined by an adhesive layer 518, there may be a difficulty in a process of connecting the flexible printed circuit board 540 to the pad unit 560 if the upper portion of the pad of the second substrate 514 is not exposed.

Accordingly, the extending first substrate 512 includes an opening portion H2 for exposing the pad unit 560 on the second substrate 514. Even after the first substrate 512 and the second substrate 514 are joined through the opening portion H2, the flexible printed circuit board 540 may be connected to the pad unit 560 on the second substrate 514.

FIG. 5*b* is a schematic plan view illustrating a rollable OLED display device according to various embodiments of the present disclosure to explain the opening portion illustrated in FIG. 5*a*. In FIG. 5*b*, for convenience of description, only the first substrate 512 having the opening portion H2 and the flexible printed circuit board 540 are illustrated, and the other constituent elements are not illustrated.

In FIG. 5*b*, the display area DA is an area above a dotted line of the first substrate 512, and the non-display area NDA is an area below the dotted line and includes a rolling unit attachment area AA. An edge of the display area DA in which wiring is formed may be the non-display area NDA, but is simply represented as the display area DA. The rolling unit attachment area AA is disposed in the non-display area NDA, and is disposed separately from the display area DA with the opening portion H2 of the first substrate 512 interposed therebetween.

Even after the first substrate 512 is joined with the second substrate 514 by the opening portion H2 of the first substrate 512, it is possible to connect the flexible printed circuit board 540 to the pad unit 560. After the pad unit 560 is connected, the rolling unit 520 is operatively attached to the rolling unit attachment area AA. The circuit unit 570 is positioned in the rolling unit 520 when the rolling unit 520 is operatively attached to the rolling unit attachment area AA.

According to the rollable OLED display device 500 according to various embodiments of the present disclosure, only the first substrate 512 is extended. It is possible to secure the rolling unit attachment area AA without making a change in design for the second substrate 514 in which more number of constituent elements are formed. Further, it is possible to secure the rolling unit attachment area AA by extending the conventionally used first substrate 512, and thus it is possible to reduce a manufacturing cost.

Since the rollable OLED display device is frequently switched from the unrolled state to the rolled state or from the rolled state to the unrolled state, durability is crucial as compared with a flat display device operating in one unrolled state. Particularly, when a foreign material is attached to one face of the rollable OLED display panel in the unrolled state, pressure is applied to the substance while the panel is rolled, and the rollable OLED display panel may be damaged. The damage of the rollable OLED display panel may be a very serious defect in terms of durability of the OLED display device. Hereinafter, in an OLED display device according to another embodiment of the present disclosure, a structure with improved visibility durability is employed.

FIG. 6*a* is a schematic enlarged cross-sectional view illustrating a rollable OLED display device according to another embodiment of the present disclosure. FIG. 6*b* is a schematic enlarged cross-sectional view for explaining a case where a foreign material flows into a rollable OLED display device according to another embodiment of the present disclosure.

In FIG. 6*a*, for convenience of description, an exaggerated scale is used. For example, a rolling unit 620 may be embodied larger than one illustrated in FIG. 6*a*, and the thickness of the rollable OLED display panel 610 may be thinner. Referring to FIG. 6*a*, a rollable OLED display device 600 includes: a rollable OLED display panel 610 including a second substrate 614, a first substrate 612, a display unit 616, an adhesive layer 618, and a pad unit 660; a rolling unit 620; a flexible printed circuit board 640; a foreign material cover layer 680; and a circuit unit 670.

The second substrate 614 supports various constituent elements of the rollable OLED display panel 610. The second substrate 614 is made of a material with flexibility, and may be made of, for example, transparent plastic such as polyimide, or thin metal to have flexibility. The second substrate 614 is a substrate where a thin film transistor is disposed. The display unit 616 is formed on the second substrate 614, and includes an organic light emitting element and the like, and displays a screen.

The adhesive layer 618 for joining the second substrate 614 and the first substrate 612 is interposed between the second substrate 614 and the first substrate 612. As the adhesive layer 618, various materials may be used, for example, a thermosetting material or a photocurable material may be used.

The flexible printed circuit board 640 is a printed circuit board with flexibility, and a control unit such as an IC chip or a circuit unit, is mounted on the flexible printed circuit board 640. The flexible printed circuit board 640 has a configuration for transmitting a signal for driving the organic light emitting element of the display unit 616 from the control unit to the organic light emitting element.

The pad 660 is a pad for connection to the flexible printed circuit board 640, and is formed on one face of the second substrate 614. The pad unit 660 may be formed of the same material as one of various conductive materials constituting the thin film transistor and the organic light emitting element formed in the display unit 616. A portion where the pad unit 660 is positioned may be designated by an end portion E of the rollable OLED display panel 610. Although not illustrated in FIG. 6*a*, the thickness of the second substrate 614 at the end portion E of the rollable OLED display panel 610 may be larger than the thickness of the second substrate 614 at the other portion of the rollable OLED display panel 610. Accordingly, when the flexible printed circuit board 640 is attached to the pad unit 660 of the rollable OLED display panel 610, it can be more stably attached. For example, the thickness of the second substrate 614 for attaching the flexible printed circuit board 640 to the rollable OLED display panel 610 can be secured equal to or more than 700 mm.

The first substrate 612 is opposed to the second substrate 614. In addition, the first substrate 612 may be made of metal. For example, the first substrate 612 may be made of opaque metal foil, metal sheet, or FSM (fabricated sheet metal). The display unit 616 may include a bottom-emission organic light emitting element in which light emitted from the organic light emitting is emitted in a direction of the second substrate 614 on which a thin film transistor for driving the organic light emitting element is formed. When the display unit 616 includes the bottom-emission organic light emitting element, a light emitting surface of the rollable OLED display panel 610 illustrated in FIG. 1 may be one face of the second substrate 614, and a non-light emitting surface may be one face of the first substrate 612.

Referring to FIG. 6*a*, the flexible printed circuit board 640 connected to the pad unit 660 is positioned in the rolling unit 620 through the opening portion of the rolling unit 620. The flexible printed circuit board 640 may be connected to the circuit unit 670. When the flexible printed circuit board 640 and the circuit unit 670 are positioned in the rolling unit 620, the circuit unit 670 is not pressurized when the rollable OLED display panel 610 is rolled on the rolling unit 620. When the circuit unit 670 is less pressurized, physical damage of the circuit unit 670 is reduced, and durability of the rollable OLED display device 600 is improved.

In the rollable OLED display panel 610, a foreign material cover layer 680 is disposed. The foreign material cover layer 680 is a protective layer that is attached to the rollable OLED display panel 610 when the OLED display panel is in the unrolled state as illustrated in FIG. 1b. Referring to FIG. 6a, the foreign material cover layer 680 is disposed under the first substrate 612 of the rollable OLED display panel 610. In other words, the foreign material cover layer 680 is attached to the non-light emitting surface of the rollable OLED display panel 610. In addition, the foreign material cover layer 680 is disposed on the entire surface of the rollable OLED display panel 610.

When the foreign material cover layer 680 is not provided, the second substrate 614 is in direct contact with the first substrate 612 when the rollable OLED display panel 610 is switched from the unrolled state to the rolled state. In this case, when a foreign material is attached from the outside to the second substrate 614 or the first substrate 612, the foreign material is pressurized by the second substrate 614 and the first substrate 612 while the rollable OLED display panel 610 is rolled. Further, the foreign material may pass through the second substrate 614 or the first substrate 612 by the pressure. When the foreign material passes through the second substrate 614 or the first substrate 612, the foreign material may damage the organic light emitting element or moisture and oxygen may permeate into the organic light emitting element to damage the organic light emitting element.

In a rollable OLED display panel 610 according to another embodiment of the present disclosure, even when the foreign material attached to the rolled rollable OLED display panel 610 is pressurized, the foreign material does not permeate into the rollable OLED display panel 610 and is covered by the foreign material cover layer 680. The rollable OLED display panel 610 can be protected from the foreign material from the outside.

The foreign material cover layer 680 may have a thickness of 10 mm to 3 mm. When the thickness of the foreign material cover layer 680 is less than 10 mm, it may be difficult to sufficiently cover the attached foreign material. When the thickness is more than 3 mm, stress applied to the rollable OLED display panel 610 is increased, and a threshold radius of curvature of the rollable OLED display panel 610 may be thereby increased. In addition, it may be difficult to embody the thin-type rollable OLED display panel 610.

The foreign material cover layer 680 has Young's modulus smaller than that of the second substrate 614. Young's modulus is a unique property of a material representing a degree in which a material extends. As Young's modulus gets lower, a shape may be easily deformed. Since the Young's modulus of the foreign material cover layer 680 is lower than that of the second substrate 614, a strain, which is a degree of an extending length of an object, of the same foreign material cover layer 680 is higher than that of the second substrate 614 in the same cross-sectional area. Accordingly, when the same pressure is applied to the second substrate 614 and the foreign material cover layer 680 by the foreign material, relatively more deformation occurs in the foreign material cover layer 680 as compared with the second substrate 614. Thus, the foreign material cover layer 680 covers this material.

The foreign material cover layer 680 is selected from resin or synthetic polymer having Young's modulus smaller than that of the second substrate 614. More specifically, it may be made of resin including any one of epoxy, phenol, amino, un-saturated polyester, rubber, polyimide, silicone, acryl, and vinyl. Alternatively, the foreign material cover layer 680 may be made of PET (polyethylene terephthalate), PE (polyethylene), synthetic urethane, pressure sensitive adhesive, PSA), or the like.

When the foreign material cover layer 680 is attached to the lower face of the first substrate 612, the second substrate 614 of the rollable OLED display panel 610 and the foreign material cover layer 680 are exposed when the rollable OLED display device 600 is in the unrolled state. In addition, when the rollable OLED display device 600 is switched from the unrolled state to the rolled state, the second substrate 614 exposed to the outside is in contact with the foreign material cover layer 680, and the foreign material is positioned between the second substrate 614 and the foreign material cover layer 680. The foreign material is pressurized while the rollable OLED display panel 610 is rolled. Since the Young's modulus of the foreign material cover layer 680 is smaller than that of the second substrate 614, the second substrate 614 is not deformed. Further, the foreign material cover layer 680 with relatively high deformability is deformed to accommodate the foreign material. For this, the Young's modulus of the foreign material cover layer 680 may be equal to or less than a half of the Young's modulus of the second substrate 614. For example, the Young's modulus of the foreign material cover layer 680 may be equal to or less than $4.8 \cdot 10^6$ psi that is a half of $9.6 \cdot 10^6$ psi that is Young's modulus when the second substrate 614 is thin film glass. When the Young's modulus of the foreign material cover layer 680 is more than the half of the Young's modulus of the second substrate 614, relative deformability of the foreign material cover layer 680 is not sufficiently higher than deformability of the second substrate 614. Accordingly, when it is pressurized by the foreign material, deformation of the foreign material cover layer 680 may not sufficiently occur. In addition, one face on which the foreign material cover layer 680 is in contact with the rollable OLED display panel 610 has adhesiveness. The foreign material cover layer 680 and the rollable OLED display panel 610 can be easily fixed to each other by the foreign material cover layer 680 with adhesiveness.

Referring to FIG. 6b, the rollable OLED display device 600 is illustrated in which a foreign material PT flows in between the rollable OLED display panel 610 and the foreign cover layer 680. Further, the rollable OLED display panel 610 is switched to the rolled state. The foreign material cover layer 680 is interposed in the rollable OLED display panel 610 in between, and the foreign material PT is positioned in the foreign material cover layer 680. Since the foreign material PT is positioned in the foreign material cover layer 680 and does not protrude, the second substrate 614 or the first substrate 612 is not pressurized by the foreign material PT, and does not damage the rollable OLED display panel 610. Accordingly, even when the rollable OLED display device 600 repeats switching between the rolled state and the unrolled state, an influence on the rollable OLED display panel 610 by the foreign material PT from the outside is minimized. Further, durability of the rollable OLED display device 600 is improved.

In addition, in FIG. 6a, it is described that the display unit 616 of the rollable OLED display panel 610 is the bottom-emission organic light emitting element, but it not limited thereto, and the display unit 616 may include a top-emission organic light emitting element. When the display unit 616 includes the top-emission organic light emitting element, the light emitting surface of the rollable OLED display panel 610 may be one face of the first substrate 612, and the non-light emitting surface may be one face of the second substrate 614. In addition, when the display unit 616 includes the top-emission organic light emitting element, the foreign material cover layer 680 may be attached to one face of the second substrate 614 that is the non-light emitting surface. In other words, unlike the case where it includes the bottom-emission organic light emitting element, the foreign material cover layer 680 may be attached to the second substrate 614. In addition, according to embodiments, the first substrate 612 may be formed of a transparent insulating material or may not be formed.

Meanwhile, in FIG. 6*a* and FIG. 6*b*, it is described that the foreign material cover layer 680 is attached to the non-light emitting surface of the rollable OLED display panel 610, but the foreign material cover layer 680 is not limited thereto, and may be attached to the light emitting surface or both of the light emitting surface and the non-light emitting surface of the rollable OLED display panel 610. When the foreign material cover layer 680 is attached to the light emitting surface of the rollable OLED display panel 610, the foreign material cover layer 680 may be made of a material with high transmissivity. In addition, in order to have sufficient deformability with respect to the foreign material, the Young's modulus of the foreign material cover layer 680 may be equal to or less than a half of the Young's modulus of the first substrate 612. FIG. 7 is a cross-sectional view illustrating a rollable OLED display device according to another embodiment of the present disclosure. In FIG. 7, constituent elements except for a foreign material cover layer 780 of constituent elements of a rollable OLED display device 700 are substantially the same as the constituent elements described with reference to FIG. 6*a*, and the overlapped description is omitted.

Referring to FIG. 7, the foreign material cover layer 780 includes a plurality of notches 782 such that a foreign material attached to the surface of the foreign material cover layer 780 more easily flows into the foreign material cover layer 780 by pressure. The plurality of local notches 782 are formed on the exposed surface of the foreign material cover layer 780, and thus the foreign material can be more easily accommodated by the foreign material cover layer 780. The surface of the foreign material cover layer 780 has the notches 782 through various processes. For example, the surface of the foreign material cover layer 780 may be chemically or physically processed to have various shapes.

Alternatively, the foreign material cover layer 780 may be thermally processed to have a wrinkle shape by contraction and expansion. In this case, the foreign material cover layer 780 can have a plurality of continuous concave portions or protrusion portions. The foreign material can be guided to the concave portions by the continuous concave portions or protrusion portions. In addition, due to a difference in Young's modulus between the second substrate 614 and the foreign material cover layer 780, the foreign material will move into the foreign material cover layer 780 even when the foreign material is pressurized. Further, the pressure applied to the second substrate 614 by the foreign material is significantly reduced.

According to the rollable OLED display device 700 illustrated in FIG. 7, the foreign material cover layer 780 has the notches 782 or the concave portions, thereby improving accommodation for the foreign material of the foreign material cover layer 780. Also, durability of the rollable OLED display device 700 can be improved.

FIG. 8 is a cross-sectional view illustrating a rollable OLED display device 800 according to still another embodiment of the present disclosure. In FIG. 8, constituent elements except for a foreign material cover layer 880 and a charging prevention layer 885 of constituent elements of a rollable OLED display device 800 are substantially the same as the constituent elements described with reference to FIG. 6*a*, and the overlapped description is omitted.

Referring to FIG. 8, a charging prevention layer 885 is formed on a foreign material cover layer 880. The charging preventing layer 885 is formed, as illustrated in FIG. 1, and is in contact with a lower face of the foreign material cover layer 880. Since the charging prevention layer 885 is formed in contact with the lower face of the foreign material cover layer 880, it is possible to minimize that external foreign materials that are attached onto the charging preventing layer 885 in a state where the rollable OLED display device 800 is unrolled. Dust or the like corresponding to the foreign material is attached onto the surface of the foreign material cover layer 880 by a charging phenomenon. Since the charging phenomenon occurs when a difference between the amount of generated charges and the amount of leaked charges is large, the charging preventing layer 885 is formed on the lower face of the foreign material cover layer 880. Also, it is possible to thereby reduce the charging phenomenon by suppressing the amount of generated charges or increasing the amount of leaked charges.

The charging prevention layer 885 may be made of a surfactant. The surfactant for configuring the charging prevention layer 885 may be selected from the group consisting of an anion surfactant, a cation surfactant, a both-ion surfactant, and a non-ion surfactant.

The thickness of the charging prevention layer 885 may be 10 mm or less. When the thickness of the charging prevention layer 885 is 10 mm or more, relative thickness of the charging prevention layer 885 with respect to the thickness of the foreign material cover layer is too large, thereby decreasing the ability of the foreign material cover layer 880 to cover the foreign material. In FIG. 8, it is described that the charging prevention layer 885 is disposed on the foreign material cover layer 880, but is not limited thereto, and the charging prevention layer 885 may be disposed on the second substrate 614. In this case, the second substrate 614 may be formed of a transparent material to allow light to pass.

According to the rollable OLED display device 800 illustrated in FIG. 8, the charging prevention layer 885 is provided on the foreign material cover layer 880. The number of foreign materials which may be attached to the charging prevention layer 885 is thereby reduced, and durability of the rollable OLED display device 800 can be improved.

FIG. 9 is a schematic enlarged cross-sectional view illustrating a rollable OLED display device according to various embodiments of the present disclosure. The rollable OLED display device illustrated in FIG. 9 is substantially the same as the rollable OLED display device 600 illustrated in FIG. 6*a* except that it is a rollable OLED display device 900 in a rolled state in which the rollable OLED display panel 610 surrounds the rolling unit 620. Further, it includes a protective member 960, and the description of overlapped constituent elements is omitted.

Referring to FIG. 9, the rollable OLED display panel 610 is disposed in a rolled state along a circumference of the rolling unit 620 on the rolling unit 620. The foreign material cover layer 680 is disposed in the rolling OLED display panel 610 in between, and is in direct contact with a light emitting surface and a non-light emitting surface of the rollable OLED display panel 610. In addition, the rollable OLED display panel 610 and the foreign material cover layer 680 are disposed alternately on the rolling unit 620. In the rollable OLED display device 900 in the rolled state, the foreign material cover layer 680 and the rollable OLED display panel 610 are alternately disposed. A foreign material flowing in the rollable organic light emitting display panel 610 in between is thereby covered by the foreign material cover layer 680. Accordingly, since pressure applied on the rollable OLED display panel 610 by the foreign material is minimized, durability of the rollable OLED display device 900 is improved.

In the rollable OLED display device 900, an end portion E of the rollable OLED display panel 610 attached to the rolling unit 650 may be exposed to the outside. Since the exposed end portion E of the rollable OLED display panel 610 protrudes, the rollable OLED display panel 610 is pressurized at a point B of the end portion of the first substrate 614 positioned at the end portion E. Also, the rollable OLED display panel 610 may be damaged.

In addition, the flexible printed circuit board 640 connected to the rollable OLED display panel 610 through the pad unit 660 may be also exposed to the outside. While the rollable OLED display panel 610 is rolled, the flexible printed circuit board 640 may be damaged by the pressure.

Referring to FIG. 9, the rollable OLED display device 900 includes the protective member 960 that covers the end portion E of the rollable OLED display panel 610 attached to the rolling unit 620. The protective member 960 is a structure for filling a void corresponding to an area X from the point A separated from the rolling unit 620 to the point B of the end portion of the first substrate 612 of the rollable OLED display panel 614. The filled areas overlap the end portion of the attached rollable OLED display panel 610. Since the rollable OLED display panel 610 is formed in the area X from the point A to the point B, the protective member 960 may be formed to also cover the flexible printed circuit board 640. As illustrated in FIG. 9, since the protective member 960 fills a void which may occur when the rollable OLED display panel 610 is overlapped, the damage of the rollable OLED display panel 610 and the damage of the flexible printed circuit board 640 by the end portion E of the rollable OLED display panel 610 are reduced. Also, it is possible to block a foreign material from flowing into the void.

In addition, the protective member 960 may be made of the same material as that of the foreign material cover layer 680. Accordingly, when the rollable OLED display device 900 is switched to the rolled state, the foreign material which may be positioned on the protective member 960 can be covered. Further, the damage of the OLED display panel caused by the foreign material can be significantly reduced.

The protective member 960 is not limited, and may be formed by various methods. The protective member 960 may be formed by molding an organic material which may be hardened in a state where the rollable OLED display panel 610 is attached to the rolling unit 620. Alternatively, the protective member 960 may be a cap having a shape corresponding to the shape of the void of the rollable OLED display panel 610. In this case, the cap-type protective member 960 may be disposed in a manner of being attached to the end portion E of the rollable OLED display panel 610 after separately manufacturing it.

According to the rollable OLED display device 900 illustrated in FIG. 9, the rollable OLED display device 900 includes the protective member 960. The void at the position where the rollable OLED display panel 610 is attached is filled. Further, various damages which may occur in the void are significantly reduced, and durability of the rollable OLED display device 900 can be improved.

FIG. 10 is a schematic enlarged cross-sectional view illustrating a rollable OLED display device according to various embodiments of the present disclosure. In FIG. 10, constituent elements except for an additional foreign material cover layer 1090 of constituent elements of a rollable OLED display device 1000 are substantially the same as the constituent elements described with reference to FIG. 6a, and the overlapped description is omitted.

Referring to FIG. 10, an additional foreign material cover layer 1090 is disposed on the surface of the rolling unit 620. In other words, the additional foreign material cover layer 1090 is interposed between the rollable OLED display panel 610 and the rolling unit 620. The additional foreign material cover layer 1090 may be made of the same material as that of the foreign material cover layer 680. Meanwhile, when the second substrate 614 of the rollable OLED display panel 610 is in direct contact with the rolling unit 620, the rollable OLED display panel 610 may be damaged by a foreign material. Accordingly, in the rollable OLED display device 1000 illustrated in FIG. 10, the additional foreign material cover layer 1090 is formed along a circumference of the rolling unit 620. Thus, it is possible to minimize damage of the rollable OLED display panel 610 even when a foreign material flows in between the second substrate 614 of the rollable OLED display panel 610 and the rolling unit 620. Accordingly, durability of the rollable OLED display device 1000 can be significantly improved.

In FIG. 10, it is illustrated that the additional foreign material cover layer 1090 is disposed on the entire face of the rolling unit 620, but it is not limited thereto. The additional foreign material cover layer 1090 is not disposed in an area where the rollable OLED display panel 610 and the rolling unit 620 are attached. Further, the rollable OLED display panel 610 and the rolling unit 620 may come in direct contact with each other to improve adhesiveness between the rollable OLED display panel 610 and the rolling unit 620.

FIG. 11 is a schematic enlarged cross-sectional view illustrating a rollable OLED display device according to various embodiments of the present disclosure. A rollable OLED display device 1100 illustrated in FIG. 11 has a structure in which a foreign material cover layer 1180 is attached to a rollable OLED display panel 610 having a rolling unit attachment area AA disposed in a non-display area NDA like the rollable OLED display device 200 illustrated in FIG. 2.

Similar to FIG. 2, the rolling unit attachment area AA is defined by a cylindrical arc having an angle equal to or less than 355°. Also, components of the rollable OLED display panel 610 extend to the outside of the rollable OLED display panel 610 in the rolling unit attachment area AA such that the rollable OLED display panel 610 is attached to the rolling unit 620. In addition, similar to FIG. 6, the foreign material cover layer 1180 has Young's modulus smaller than that of the second substrate 614.

Accordingly, in the rollable OLED display device 1100 illustrated in FIG. 11, visibility on a screen displayed in the display area DA in the rollable OLED display device 1100 can be improved. At the same time, even when the foreign material attached to the rolled rollable OLED display panel 1100 is pressurized, the foreign material does not permeate into the rollable OLED display panel 1100. The rolled rollable OLED display panel 1100 is covered by the foreign material cover layer 1180, and the rollable OLED display panel 610 can be protected from the foreign material from the outside.

The embodiments of the present disclosure have been described in more detail with reference to the accompanying drawings, but the present disclosure is not necessarily limited to such embodiments, and may be variously modified within the scope which does not deviate from the technical spirit of the present disclosure. Therefore, the embodiments described in the present disclosure are not to restrict the technical spirit of the present disclosure but are to explain it, and the scope of the technical spirit of the present disclosure is not restricted by such embodiments. Therefore, it should be understood that the embodiments described above are exemplary in all aspects, and are not restrictive. The protection range of the present disclosure should be understood by the following Claims, and it should be understood that all the technical spirits within the scope equivalent thereto are included in the right scope of the present disclosure.

The invention claimed is:

1. A rollable organic light emitting diode (OLED) display device comprising:
   a rollable OLED display panel that includes a first substrate, a second substrate opposed to the first substrate, a pad unit connected to a circuit unit and disposed on the second substrate, a display area, and a nondisplay area extending from the display area, the nondisplay area including a rolling unit attachment area separated from the display area by at least a distance such that the display area is not concealed by the rolling unit; and
   a rolling unit attached to one of the first substrate and the second substrate in the rolling unit attachment area configured to rotate the rollable OLED display panel between unrolled state, in which the entirety of the display area is exposed to the outside, and a rolled state, wherein the rolling unit is in a cylindrical shape, and the rolling unit attachment area is defined by an arc of the cylindrical shape having an angle of 355° or less.

2. The rollable OLED display device according to claim 1, wherein the first substrate is made of metal, and
   wherein the rolling unit is attached to the first substrate in the rolling unit attachment area.

3. The rollable OLED display device according to claim 2, wherein an area of the first substrate is larger than an area of the second substrate.

4. The rollable OLED display device according to claim 3, wherein the first substrate includes an opening portion for exposing the pad.

5. The rollable OLED display device according to claim 1, wherein the rollable OLED display panel further includes a polarizing plate that has a part extending from an edge of the rollable OLED display panel, wherein the rolling unit attachment area is in an area of the extending part of the polarizing plate, and
   wherein the rolling unit is attached to the polarizing plate in the rolling unit attachment area.

6. The rollable OLED display device according to claim 1, wherein the rollable OLED display panel further includes a protective film that has a part extending from an edge of the rollable OLED display panel,
   wherein the rolling unit attachment area is in an area of the extending part of the protective film, and
   wherein the rolling unit is attached to the protective film in the rolling unit attachment area.

7. The rollable OLED display device according to claim 1, wherein the rollable OLED display panel further includes a connection unit that has a part extending from an edge of the rollable OLED display panel,
   wherein the rolling unit attachment area is in an area of the extending part of the connection unit, and
   wherein the rolling unit is attached to the connection unit in the rolling unit attachment area.

8. The rollable OLED display device according to claim 1, further comprising a foreign material cover layer that is attached to a light emitting surface or a non-light emitting surface of the rollable OLED display panel and has a Young's modulus for covering a foreign material which may be attached to the rolling unit or the rollable OLED display panel.

9. The rollable OLED display device according to claim 1, wherein the rolling unit attachment area is defined by an arc of the cylindrical shape having an angle of greater than 80° and less than 355°.

10. A rollable OLED display device comprising:
    a rollable OLED display panel including a substrate;
    a rolling unit in operative contact with the rollable OLED display panel, and is configured to rotate such that the rollable OLED display panel is in a rolled state and an unrolled state;
    a foreign material cover layer that is attached to a light emitting surface or a non-light emitting surface of the rollable OLED display panel, and has a Young's modulus less than a Young's modulus of the substrate.

11. The rollable OLED display device according to claim 10, wherein the Young's modulus of the foreign material cover layer is equal to or less than a half of the Young's modulus of the substrate or equal to or less than $4.8 \cdot 10^6$ psi (pound per square inch).

12. The rollable OLED display device according to claim 10, wherein a face of the foreign material cover layer in contact with the rollable OLED display panel has adhesiveness.

13. The rollable OLED display device according to claim 10, wherein the foreign material cover layer has a notch or a concave portion for accommodating a foreign material.

14. The rollable OLED display device according to claim 10, further comprising a charging prevention layer on the foreign material cover layer.

15. The rollable OLED display device according to claim 10, further comprising a protective member for protecting an end portion of the rollable OLED display panel,
    wherein the rolling unit is attached to the end portion of the rollable OLED display panel, and
    wherein the thickness of the substrate at the end portion of the rollable OLED display panel is larger than the thickness of the substrate at the other portion of the rollable OLED display panel.

16. The rollable OLED display device according to claim 10, further comprising an additional foreign material cover unit that is attached to at least a part of the surface of the rolling unit.

17. The rollable OLED display device according to claim 16, wherein the rollable OLED display panel is a bottom-emission OLED display panel.

18. The rollable OLED display device according to claim 10, wherein the rollable OLED display panel includes a component that extends outward from the rollable OLED display panel such that the rollable OLED display panel is attached to the rolling unit, and
    wherein the component of the rollable OLED display panel includes at least one of:
    a first substrate;
    a second substrate that is opposed to the first substrate;

a polarizing plate on the first substrate or the second substrate;
a protective film on the first substrate or the second substrate;
a connection portion that has a portion extending from an edge of the rollable OLED display panel.

* * * * *